United States Patent [19]

De Bruin et al.

[11] Patent Number: 5,063,169

[45] Date of Patent: Nov. 5, 1991

[54] SELECTIVELY PLATING CONDUCTIVE PILLARS IN MANUFACTURING A SEMICONDUCTOR DEVICE

[75] Inventors: Leendert De Bruin; Robertus D. J. Verhaar; Josephus M. F. G. Van Laarhoven, all of Eindhoven, Netherlands

[73] Assignee: U.S. Philips Corporation, New York, N.Y.

[21] Appl. No.: 531,825

[22] Filed: Jun. 1, 1990

[30] Foreign Application Priority Data

Jun. 26, 1989 [GB] United Kingdom ............... 8914627

[51] Int. Cl.⁵ ......................................... H01L 21/445
[52] U.S. Cl. ..................................... 437/41; 437/192; 437/200; 437/230; 148/DIG. 26
[58] Field of Search ............... 437/230, 196, 200, 201, 437/192, 41; 148/DIG. 147, DIG. 26, DIG. 19

[56] References Cited

U.S. PATENT DOCUMENTS

| 4,087,314 | 5/1978 | George et al. ................. 437/192 |
| 4,434,544 | 3/1984 | Dohya et al. ................. 437/196 |
| 4,692,349 | 9/1987 | Georgiou et al. ............... 437/230 |
| 4,822,749 | 4/1989 | Flanner et al. ................ 437/200 |
| 4,963,512 | 10/1990 | Iwanaga et al. .............. 437/230 |

FOREIGN PATENT DOCUMENTS 0195977 10/1986 European Pat. Off. .
0318750 12/1988 Japan ................................ 437/230

Primary Examiner—Brian E. Hearn
Assistant Examiner—C. Chaudhari
Attorney, Agent, or Firm—Norman N. Spain

[57] ABSTRACT

Electrical connection to a device region (3,4) of a semiconductor device is formed by providing a semiconductor body (1) having adjacent one major surface (12) a device region (3,4) bounded by an insulating region (19a,19b,9), providing an activating layer (11) on the one major surface (12), applying a flowable material as a layer (13) of photosensitive resist, exposing and developing the resist to define an opening (14) over a contact area (12a) of the device region (3,4), and selectively plating electrically conductive material into the opening (14) to form a conductive pillar (15) in electrical contact with the contatct area (12a). The layer (13) of photosensitive resist is removed after formation of the conductive pillar (15) and a layer of insulating material is then provided to cover the conductive pillar (15) and the surface (12). The insulating layer is then etched to expose a top surface (15a) of the conductive pillar (15).

10 Claims, 2 Drawing Sheets

SELECTIVELY PLATING CONDUCTIVE PILLARS IN MANUFACTURING A SEMICONDUCTOR DEVICE

BACKGROUND OF THE INVENTION

This invention relates to a method of manufacturing a semiconductor device, which method comprises providing a semiconductor body having adjacent one major surface a device region bounded by an insulating region, providing an electrical connection to the device region by providing an activating layer on the one major surface, applying a flowable insulating material to form a layer on the one major surface, defining an opening through the insulating flowable material layer thereby exposing a contact area of the device region, and selectively depositing electrically conductive material into the opening to form a conductive pillar in electrical contact with the contact area.

Such a method is described in EP-A-0195977. As described in EP-A-0195977, the flowable insulating material comprises a layer of polyimide which is spun onto the one major surface so providing a relatively flat surface. An oxide layer is provided on the polyimide layer and is followed by a photosensitive resist which is developed to form the masking layer through which the insulating flowable material layer is etched using a wet or a dry etchant. Tungsten is then selectively deposited to form the conductive pillar in the opening etched in the dielectric by chemical vapour deposition using $WF_6$ and $H_2$. In order to facilitate tungsten deposition by using, for example, a lift-off technique, an activating or nucleation layer is provided in the opening. After formation of the conductive pillar, a further layer of polyimide is spun onto the surface and the above-mentioned steps repeated. Where it is desired, as shown in FIG. 8 of EP-A-0195977, to interconnect two or more pillars by a second metallization level, then a nucleation layer will normally be required to enable selective deposition of tungsten over the first polyimide layer. This process may be repeated one or more further times depending on the desired number of metallization levels. This method relies on the spun-on polyimide layers to provide the insulating or dielectric material which isolates conductive pillars from one another so that only the desired electrical connections are made. Polyimide is, however, susceptible to cracking and contamination and therefore may not provide sufficiently good insulation so that short-circuits may, for example, occur.

SUMMARY OF THE INVENTION

It is an object of the present invention to provide a method of manufacturing a semiconductor device which enables good electrical connection to a device region while avoiding or at least reducing the above-mentioned problems.

According to the present invention, there is provided a method of manufacturing a semiconductor device, which method comprises providing a semiconductor body having adjacent one major surface a device region bounded by an insulating region, providing electrical connection to the device region by providing an activating layer on the one major surface, applying a insulating flowable material to form a layer on the one major surface, defining an opening through the flowable material layer thereby exposing a contact area of the device region, and selectively depositing conductive material into the opening to form a conductive pillar in electrical contact with the contact area, characterised by applying the flowable material as a layer of a photosensitive resist, exposing and developing the resist to define the opening, selectively plating the electrically conductive material into the opening to form the pillar, removing the layer of photosensitive resist after formation of the conductive pillar, providing a layer of insulating material covering the conductive pillar and the surface, and etching the insulating layer to expose a top surface of the conductive pillar.

DETAILED DESCRIPTION OF THE DRAWING

Figure 1:
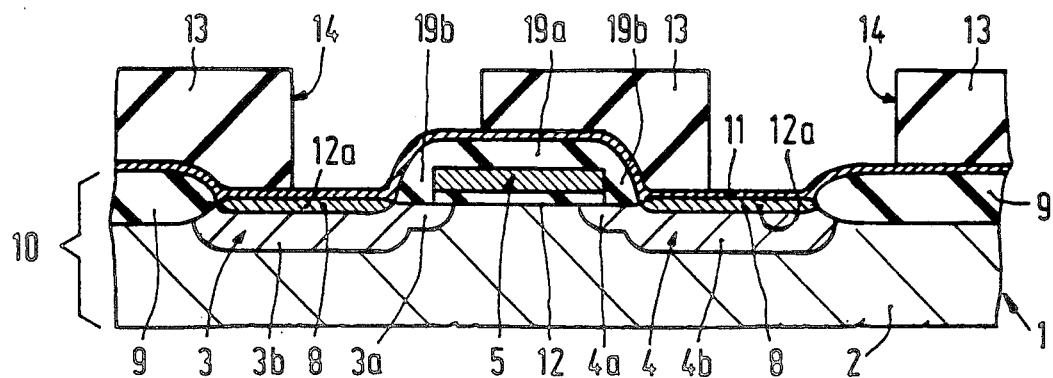
FIGS. 1 to 6 are cross-sectional views of stages in the manufacture of part of a semiconductor body in accordance with the method of the invention.

Using a method embodying the invention avoids having to rely on the same material to provide the flowable material masking layer for the plating process and to provide dielectric isolation of the conductive pillars thereby enabling relatively freely available and inexpensive photosensitive resist materials (such as HPR204) to be used as the flowable material layer during plating while allowing a relatively good dielectric, for example a silicon oxide layer formed by a chemical vapour deposition technique, to be used for dielectric isolation. In addition, by defining the opening or contact hole by exposing or developing a photosensitive resist, the contact hole can be formed without significantly affecting the material comprising the underlying device and insulating regions so that very little, if any, of the underlying material is removed during the definition of the conductive pillar thereby enabling, for example, the contact hole or opening to overlap onto gate isolation or field oxide without risk of undesired short-circuits between, for example, a device region being contacted by the conductive pillar and an insulated gate.

Nickel may be the electrically conductive material which is selectively plated into the opening. The activating layer may be provided as a plating layer of electrically conductive material, for example a titanium-tungsten alloy, prior to applying the flowable material and the plating layer used as an electrode during selective electroplating to form the conductive pillar. Alternatively, the activating layer may be provided as a nucleating layer comprising a precious metal selected from the group consisting of palladium, platinum and rhodium for facilitating electroless plating of the conductive material to form the conductive pillar.

The layer of insulating material may be provided by depositing a layer of silicon oxide, applying a resist layer to the silicon oxide to provide a flatter surface and then etching the silicon oxide and resist layers at the same rate thereby enabling a relatively flat surface to be provided at which the top surface of the conductive pillar is exposed in a relatively reliable and reproducible manner.

For a better understanding, embodiments of the invention will now be described, by way of example, with reference to the accompanying drawings.

It should be understood that the Figures are merely schematic and are not drawn to scale. In particular certain dimensions such as the thickness of layers or regions may have been exaggerated while other dimensions may have been reduced. It should also be understood that the same reference numerals are used throughout the Figures to indicate the same or similar parts.

Referring now to the drawings, there is illustrated a method of manufacturing a semiconductor device, which method comprises providing a semiconductor body 1 having adjacent one major surface 12 a device region 3, 4 bounded by an insulating region 19a, 19b, 9, providing an electrical connection to the device region 3, 4 by providing an activating layer 11 on the one major surface 12 of the substructure 10, applying a flowable insulating material to form a layer 13 on the one major surface 12, defining an opening 14 through the flowable material layer 13 thereby exposing a contact area 12a of the device region 3, 4 and selectively depositing electrically conductive material into the opening 14 to form a conductive pillar 15 in electrical contact with the contact area 12a.

In accordance with the invention, the method further comprises applying the flowable material as a layer 13 of photosensitive resist, exposing and developing the resist to define the opening 14, selectively plating the electrically conductive material into the opening 14 to form the pillar 15, removing the layer 13 of photosensitive resist after formation of the conductive pillar 15, providing a layer of insulating material 16, 17 covering the conductive pillar 15 and the surface 12, and etching the insulating layer 16, 17 to expose a top surface 15a of the conductive pillar 15.

Using such a method avoids having to rely on the same material to provide the flowable material masking layer 13 for the plating process and to provide dielectric isolation of the conductive pillars 15 so enabling relatively freely available and inexpensive photosensitive resist materials (such as HPR204) to be used as the flowable material layer 13 while allowing a relatively good dielectric, for example a silicon oxide layer formed by a chemical vapour deposition technique to be used for dielectric isolation. In addition, because the opening or contact hole 14 is defined by exposing or developing a photosensitive resist layer 13, the opening 14 can be formed without significantly affecting the underlying device and insulating regions 10 so that very little, if any, of the underlying material is removed during formation of the opening 14 enabling, as will be discussed below, the opening or contact hole 14 to overlap onto adjacent gate isolation or field oxide without risk of short-circuits. Moreover, the problems of cracking and/or contamination which may occur when a flowable material such as polyimide is used as an insulating layer may be avoided or at least reduced.

In the example shown in the Figures, the semiconductor device comprises a monocrystalline silicon semiconductor body 1 having adjacent one major surface 12 of the semiconductor body 1 a relatively lightly doped region 2 of one conductivity type, in this example p-conductivity type, within which more highly doped device regions 3, 4 of the opposite conductivity type, in this example n-conductivity type, are provided adjacent the one surface 12. Although only two device regions 3, 4 are shown in FIG. 1, it will be appreciated that the semiconductor body 1 will have many such device regions provided therein. In this example, the device regions 3, 4 are associated with insulated gate structures 5 (only one being shown) provided on the one surface 12 to form insulated gate field effect transistors (IG-FETs). The device regions 3, 4 mentioned above, being of n-conductivity type form n-channel IGFETs. However, as will be appreciated by those skilled in the art, the semiconductor body may also contain p-channel IGFETs, so as to form a CMOS integrated circuit, with the p-channel IGFETs being formed by p-conductivity type device regions provided within an n-conductivity type well and, of course, associated insulated gates.

The devices described above are formed in the semiconductor body 1 by, after definition of a field oxide pattern (part of an insulating region 9 of which is shown in FIG. 1) by conventional local oxidation of silicon (LOCOS) techniques, forming the insulated gates 5 in conventional manner by growing a gate oxide layer on the surface 12 and then providing a doped polycrystalline silicon layer on the gate oxide layer. The doped polycrystalline silicon layer is locally capped by an insulating region 19a of, for example, silicon oxide and/or silicon nitride. After patterning by conventional photolithographic and etching techniques lowly doped extension regions 3a, 4a of the device regions 3, 4 are formed in self-aligned manner using the insulated gates 5 and the field oxide pattern 9 as a mask.

A silicon oxide or silicon nitride layer 19 is then deposited by a conventional chemical vapour deposition technique and etched using a suitable known anisotropic etching process to provide, as shown in FIG. 1, insulating spacer regions 19b on the side walls of the insulated gate 5 which, together with the insulating capping region 19a, encapsulate the insulated gate 5 to avoid undesired shorting by subsequent metallization between the insulated gate 5 and a device region 3, 4. Although not shown, other insulated gates of the device need not necessarily all be provided with a capping region 12a.

After formation of the spacer regions 19b, more highly doped regions 3b, 4b of the device regions 3, 4 are formed in conventional self-aligned manner using the insulated gate 5, spacer regions 19b and field oxide insulating regions 9 as a mask.

In order to improve ohmic contact to the device regions 3, 4, silicide regions 8, for example titanium or cobalt silicide, are formed at the surfaces of the device regions 3, 4 in known manner by depositing a layer of titanium or cobalt and heating.

A substructure 10 is thus formed and, as will be described below, conductive pillars 15 are then formed and, as will be described below, conductive pillars 15 are then formed contacting, in the example shown, the silicide regions 8 provided on the device regions 3, 4.

In order to form the conductive pillars 15, the activating layer 11 is first provided on the surface 12. Where a conventional electroplating technique is to be used the activating layer 11 will serve as a plating layer forming one electrode of the electroplating system and may be, for example, a layer of a titanium-tungsten alloy which may be deposited by a conventional chemical vapour deposition or sputter deposition technique. Alternatively, if an electroless plating method is to be used, then the activating layer 11 will be provided to form a nucleating layer, for example as a layer of a precious metal such as palladium, platinum or rhodium or a titanium-tungsten alloy or amorphous silicon, to facilitate initiation of the plating process.

A photosensitive resist (for example HPR204) is then spun onto the one major surface 12 to form the layer 13 of flowable material. The photosensitive resist is then patterned using conventional photolithographic and developing techniques to define openings 14 (two of which are shown in FIG. 1) where connection is desired to be made to a device region 3, 4.

The photosensitive resist layer 13 is then cured or baked in conventional manner. The openings 14 are thus formed by a process which does not significantly affect the underlying substructure 10 so that very little, if any, of the underlying material comprising the device and insulating regions is removed during formation of the openings 14 enabling the openings 14 to overlap, as shown in FIG. 1, onto adjacent gate isolation 19a, 19b or field oxide 9 insulating regions without causing undesired short-circuits.

The substructure 10 is then placed within a conventional plating bath to enable electrically conductive material, in this example nickel, to be plated into the openings 14. Where a conventional electroplating process is used so that the activating layer 11 forms an electrode of the electroplating system, then the plating process may be carried out using any suitable nickel ion containing electroplating solution. Where an electroless plating process is used then the plating process may be carried out using a suitable aqueous solution of nickel ions and reducing agents, for example of the type described in U.S. Pat. No. 4,692,349.

Figure 2:
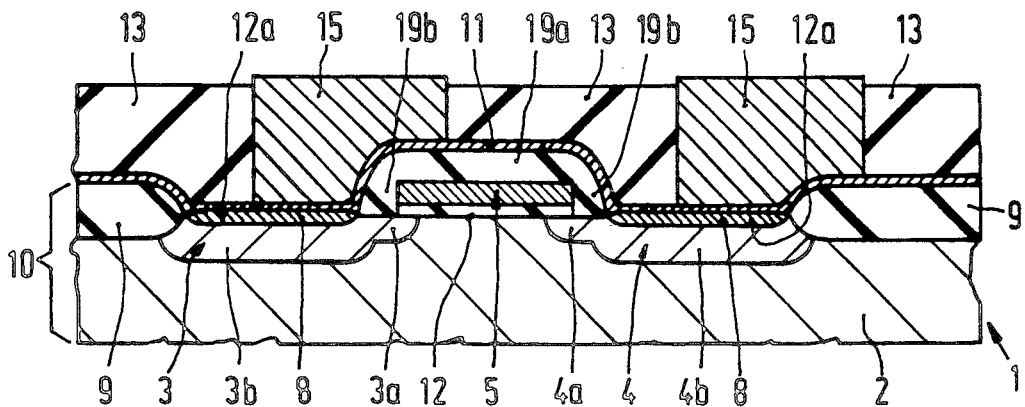

After formation of the electrically conductive pillars 15 the produce the structure shown in FIG. 2, the photosensitive resist layer 13 is removed using conventional means, for example an oxygen plasma etching process or a wet chemical etching process, which enables the photosensitive resist layer 13 to be removed with high selectivity relative to the underlying substructure 10. The exposed parts of the activating layer 11 are then selectively etched away using the conductive pillars 15 as a mask. Where the activating layer 11 is a layer of titanium-tungsten alloy then it may be selectively etched away using, for example, $H_2O_2$-acetic acid mixtures, possibly using an appropriate mask to enable the formation of, for example, conductive connecting straps (not shown) on the field oxide insulating regions 9 for connecting device regions 3, 4 and insulated gates 5. Where the activating layer 11 is a layer of a precious metal such as palladium, platinum or rhodium then sputter etching or ion milling with argon may be used to remove the activating layer 11.

Figure 3:
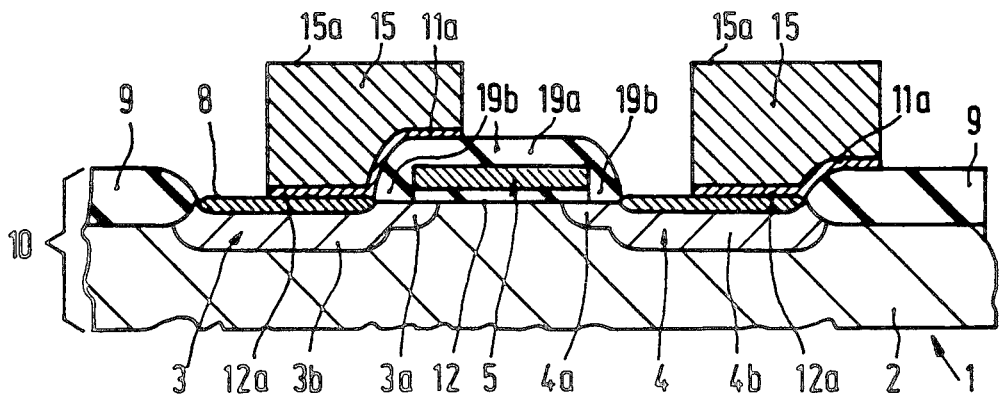

As shown in FIG. 3, this etching process leaves portions 11a of the electrically conductive activating layer beneath the conductive pillars 15. The removal of the photosensitive resist layer 13 thus enables the activating layer 11 to be deposited so as to cover the entire surface of the substructure 10 without causing short-circuits which might otherwise occur if the photosensitive resist layer 13 was retained as a dielectric.

Figure 4:
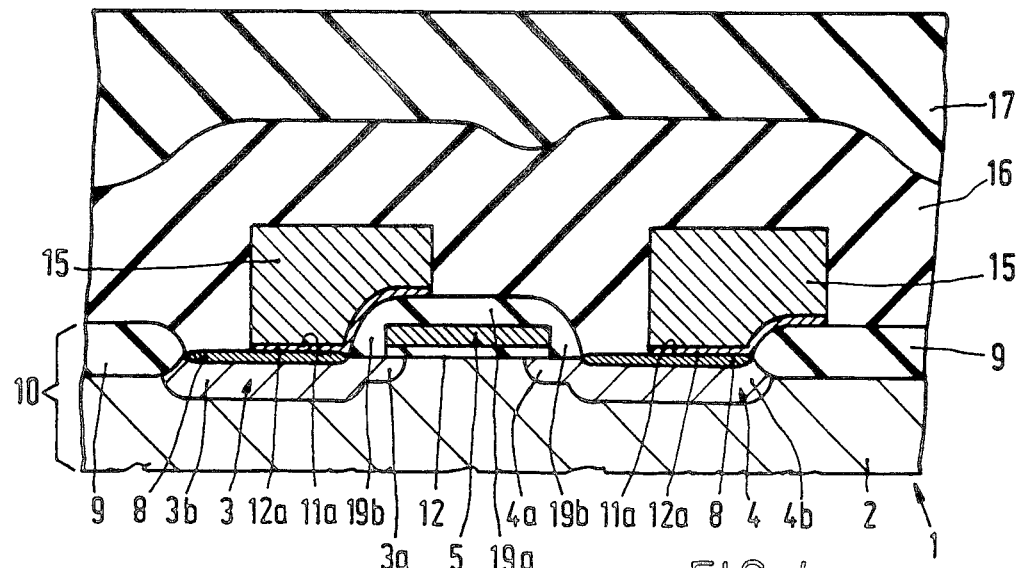
Figure 5:
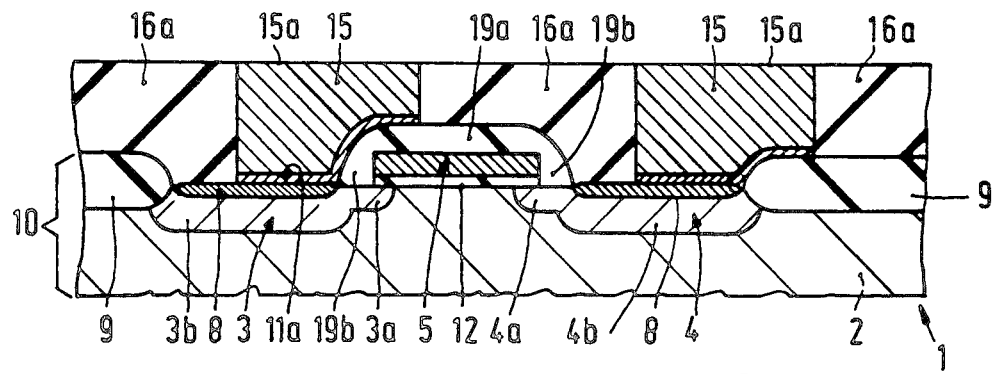

The insulating layer 16, 17 is then provided by first depositing a layer 16 of silicon oxide using a conventional chemical vapour deposition technique. A further layer 17 of photosensitive resist is then spun onto the silicon oxide layer 16 to provide a relatively flat surface (FIG. 4) and the further insulating layer 16, 17 etched using, for example, a $CF_4$ and $O_2$ plasma which etches the silicon oxide layer 16 and the photosensitive resist layer 17 at the same rate until the top surfaces 15a of the conductive pillars 15 are exposed thus providing a relatively flat surface as shown in FIG. 5 contacting, in the example shown, the silicide regions 8 provided on the device regions 3, 4.

Figure 6:
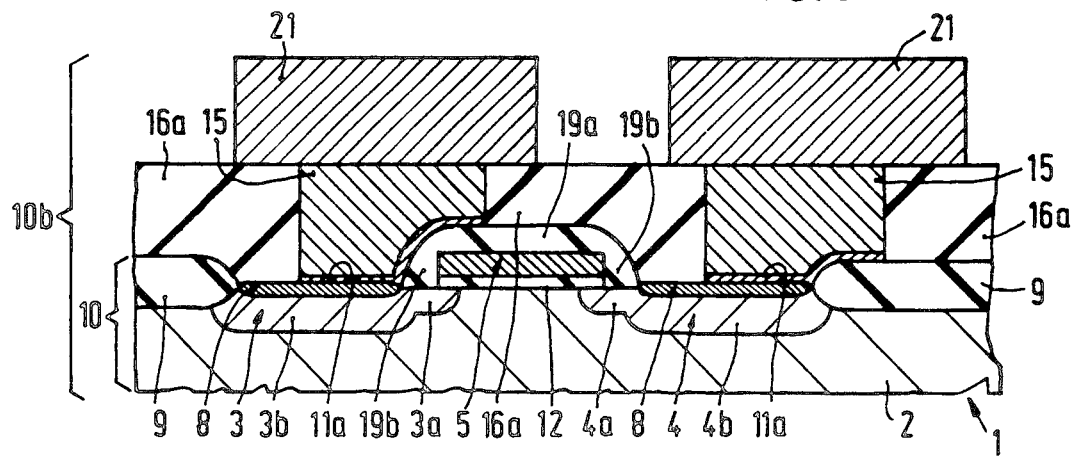

A layer 21 of metallisation, for example aluminium, may then be deposited and patterned as required to provide conductive tracks which may (although not shown) connect various of the conductive pillars 15. The method described with reference to FIGS. 1 to 5 may be repeated with the patterned metallisation layer 21 (only two tracks of which are shown in FIG. 6) and an intervening dielectric layer (not shown) forming the surface of a substructure 10b to which electrical connection is to be made.

Although in the methods described above the conductive pillars 15 have been formed by plating nickel into the openings 14, other electrically conductive materials may be plated into the openings 14. Also, although FIGS. 1 to 6 illustrate the openings 14 as having substantially vertical side walls, as is known in the art an image reversal resist may be used so as to provide openings 14 which become more narrow towards the free surface of the photosensitive resist layer 13 thereby enabling the formation of conductive pillars 15 having inwardly sloping walls, that is frusto-conical shaped pillars, which enable better coverage by the subsequent insulating layer 16.

The use of the photosensitive resist layer 13 enables the openings or contact holes 14 to be formed without significantly affecting the underlying substructure 10 so that very little of the material forming the device and insulating regions is etched during formation of the contact holes or openings 14. Also the activating layer 11 can be provided beneath the photosensitive resist layer 13 because exposed portions of the activating layer 11 can be removed after removal of the photosensitive resist layer 13, so avoiding possible short-circuits. Thus, because the process used to open the contact holes 14 does not attack underlying device regions or gate isolation and growth of the conductive material on insulating material is facilitated, the conductive pillars 15 can extend or overlap onto adjacent field oxide 9 or insulating layers 19a, 19b without risk of undesired shorting of, for example, a device region 3, 4 contacted by a pillar 15 to, for example, an insulated gate 5 or a connecting conductive strap (not shown) on the field oxide 9. The method is thus more tolerant of misalignment of the contact holes or openings 21 than conventional methods.

From reading the present disclosure, other modifications will be apparent to persons skilled in the semiconductor art and which may be used instead of or in addition to features already described herein.

We claim:

1. A method of manufacturing a semiconductor device, which method comprises providing a semiconductor body having adjacent one major surface a device region bounded by an insulating region and forming an electrical connection to the device region by providing an activating layer on the one major surface, applying a photosensitive resist material to form a photosensitive resist layer on the one major surface, exposing and developing the photosensitive resist layer to define an opening through the photosensitive resist layer thereby exposing a contact area of the device region, and selectively depositing conductive material into the opening to form a conductive pillar which pillar has a top surface and which pillar is in electrical contact with the contact area, removing the photosensitive resist layer after formation of the conductive pillar, providing a layer of an inorganic insulating material to cover the conductive pillar and said major surface, applying a resist layer to the inorganic insulating material layer and etching the insulating and resist layers at the same rate to expose the top surface of the electrically conductive pillar and to provide a relatively flat surface for the insulating material bounding the conductive pillar.

2. A method according to claim 1, further comprising providing the activating layer as a plating layer of electrically conductive material prior to applying the flowable material and using the plating layer as an electrode during selective electroplating to form the conductive pillar.

3. A method according to claim 2, further comprising providing the plating layer as a layer of a titanium-tungsten alloy.

4. A method according to claim 1, further comprising providing the activating layer as a nucleating layer comprising a precious metal selected from the group consisting of palladium, platinum and rhodium for facilitating electroless plating of the conductive material to form the conductive pillar.

5. A method according to claim 3, further comprising selectively plating nickel into the opening to form the conductive pillar.

6. A method according to claim 1, further comprising providing the layer of inorganic insulating material by depositing a layer of silicon oxide, applying a resist layer to the silicon oxide to provide a flatter surface and then etching the further layer so that the silicon oxide and resist are etched at the same rate thereby providing a relatively flat surface upon exposure of the top surface of the conductive pillar.

7. A method of manufacturing a semiconductor device, which method comprises providing a semiconductor body having adjacent one major surface a device region bounded by an insulating region and forming an electrical connection to said device region by providing a layer of a titanium-tungsten alloy as a plating layer on the one major surface, applying a photosensitive resist layer on the one major surface, exposing and developing the photosensitive resist layer to define an opening through the photosensitive resist layer thereby exposing a contact area of said device region, selectively plating nickel material into said opening to form a conductive pillar which pillar has a top surface and which pillar is in electrical contact with the contact area, removing the photosensitive resist layer after formation of the conductive pillar, providing a layer of an inorganic material to cover the conductive pillar and said major surface, and etching the insulating layer to expose the top surface of said conductive pillar.

8. A method of manufacturing a semiconductor device, which method comprises providing a semiconductor body having adjacent one major surface a device region bounded by an insulating region and forming an electrical connection to the device region by providing an activating layer comprising a material selected from the group consisting of palladium, platinum and rhodium on the one major surface, applying a photosensitive resist material to form a photosensitive resist layer on the one major surface, exposing and developing the photosensitive resist layer to thereby define an opening through the photosensitive resist layer exposing a contact area of the device region, selectively electrolessly plating nickel into said opening to form a conductive pillar, which pillar has a top surface and which pillar is in electrical contact with the contact area, removing the photosensitive resist layer after formation of the conductive pillar, providing a layer of an inorganic insulating material to cover the conductive pillar and said major surface, and etching the layer of insulating material to expose the top surface of said conductive pillar.

9. A method according to claim 4, further comprising selectively plating nickel into the opening to form the conductive pillar.

10. A method according to claim 7, further comprising providing a layer of a silicon oxide as the layer of inorganic insulating material.

* * * * *